United States Patent
Hon et al.

(10) Patent No.: US 11,770,051 B2
(45) Date of Patent: Sep. 26, 2023

(54) BRUSHLESS MOTOR ASSEMBLY

(71) Applicant: MOBILETRON ELECTRONICS CO., LTD., Taichung (TW)

(72) Inventors: Wen-Shing Hon, Taichung (TW); Shih-Hao Wang, Tainan (TW)

(73) Assignee: MOBILETRON ELECTRONICS CO., LTD., Taichung (TW)

( * ) Notice: Subject to any disclaimer, the term of this patent is extended or adjusted under 35 U.S.C. 154(b) by 209 days.

(21) Appl. No.: 17/186,403

(22) Filed: Feb. 26, 2021

(65) Prior Publication Data

US 2021/0298196 A1  Sep. 23, 2021

(30) Foreign Application Priority Data

Mar. 19, 2020  (TW) ................ 109109089

(51) Int. Cl.
*H02K 9/22* (2006.01)
*H02K 11/33* (2016.01)
(Continued)

(52) U.S. Cl.
CPC ............ *H02K 9/22* (2013.01); *H02K 9/227* (2021.01); *H02K 11/33* (2016.01);
(Continued)

(58) Field of Classification Search
CPC .... H02K 11/30; H02K 11/33; H02K 2211/03; H02K 9/00; H02K 5/18; H02K 11/38;
(Continued)

(56) References Cited

U.S. PATENT DOCUMENTS 11,349,375 B2 * 5/2022 De Filippis ........ H02K 11/0094
2008/0116838 A1 5/2008 Hattori et al.
(Continued)

FOREIGN PATENT DOCUMENTS

CN  102104296 A  6/2011
CN  104604115 A  5/2015
(Continued)

OTHER PUBLICATIONS

Kim et al, BLDC Motor, Apr. 20, 2011, KR 20110039785 (English Machine Translation) (Year: 2011).*
(Continued)

*Primary Examiner* — Alexander A Singh
(74) *Attorney, Agent, or Firm* — Apex Juris, pllc; R. Lynette Wylie

(57) ABSTRACT

A brushless motor assembly includes a motor body, a circuit board, and a plurality of electronic elements. The circuit board is disposed on the motor body and has a first surface and a second surface which face opposite directions. The first surface faces the motor body. The second surface has a plurality of thermoconductive layouts. The electronic elements include a plurality of power switching elements disposed on the second surface. A plurality of heat sinks is disposed on the second surface. Each of the power switching elements and each of the heat sinks are connected to each of the thermoconductive layouts, so that a thermal energy generated by each of the power switching elements is transferred to each of the heat sinks through each of the thermoconductive layouts. This configuration thereby reduces an overall volume of the brushless motor assembly.

10 Claims, 8 Drawing Sheets

(51) Int. Cl.
*H05K 7/20* (2006.01)
*H05K 1/02* (2006.01)

(52) U.S. Cl.
CPC ........ *H02K 2211/03* (2013.01); *H05K 1/0209* (2013.01); *H05K 7/209* (2013.01); *H05K 2201/066* (2013.01); *H05K 2201/1009* (2013.01)

(58) Field of Classification Search
CPC .. H02K 9/02; H02K 9/04; H02K 9/06; H02K 9/08; H02K 9/10; H02K 9/12; H02K 9/14; H02K 9/16; H02K 9/18; H02K 9/19; H02K 9/193; H02K 9/197; H02K 9/22; H02K 9/227; H05K 7/209; H05K 1/0209; H05K 2201/10166; H05K 2201/1009; H05K 2201/066; H05K 2201/09027; B25F 5/008; B62D 5/0406
USPC ..................................... 310/68 R, 52, 58, 64
See application file for complete search history.

(56) References Cited

U.S. PATENT DOCUMENTS

| | | | | |
|---|---|---|---|---|
| 2017/0110946 | A1* | 4/2017 | Oktavec | B24B 23/028 |
| 2017/0366073 | A1* | 12/2017 | Hieda | H02K 11/33 |
| 2018/0338374 | A1* | 11/2018 | Li | H05K 1/0204 |
| 2019/0014692 | A1* | 1/2019 | Shibata | H05K 1/0203 |
| 2021/0068313 | A1* | 3/2021 | Lee et al. | H02P 27/06 |

FOREIGN PATENT DOCUMENTS

| | | | |
|---|---|---|---|
| CN | 105075093 | A | 11/2015 |
| CN | 109660153 | A | 4/2019 |
| CN | 110620476 | A | 12/2019 |
| JP | 2005116625 | A | 4/2005 |
| KR | 20110039785 | A | 4/2011 |
| KR | 1020110039785 | * | 4/2011 |
| TW | M580260 | U | 7/2019 |

OTHER PUBLICATIONS

English abstract for CN110620476, Total of 1 page, Pub date: Dec. 27, 2019.
English abstract for CN102104296, Total of 1 page, Pub date: Jun. 22, 2011.
English abstract for JP2005116625, Total of 1 page, Pub date: Apr. 28, 2005.
English abstract for TWM580260, Total of 1 page, Pub date: Jul. 1, 2019.
English abstract for KR20110039785, Total of 1 page, Pub date: Apr. 20, 2011.
English abstract for CN109660153, Total of 1 page, Pub date: Apr. 19, 2019.
English abstract for CN104604115, Total of 1 page, Pub date: May 6, 2015.
English abstract for CN105075093, Total of 1 page, Pub date: Nov. 18, 2015.
Search report for CN202010218531.3, dated Apr. 2, 2022, Total of 2 pages.

* cited by examiner

BRUSHLESS MOTOR ASSEMBLY

BACKGROUND OF THE INVENTION

Technical Field

The present invention relates generally to a brushless motor, and more particularly to a direct-current (DC) brushless motor assembly.

Description of Related Art

Most of power motors used in many conventional electric machinery and electric tools are brushless DC motors (BLDCM), and the reason for adopting brushless DC motor is that the brushless DC motor has a higher torque-to-moment-of-inertia ratio without disadvantages of brush motors (for example: brush wear, commutation sparks, excessive noise, etc.).

The brushless DC motor uses a plurality of switching elements to switch between different phases. During the operation of the brushless DC motor, these switching elements are power transistors and must be switched repeatedly in the on and off states. Therefore, the heat dissipation of the switching elements is an urgent problem to be improved.

A conventional practice is to stack a heat sink on the switching element, so that the heat sink is attached to the surface of the switching element. Although the aforementioned way could achieve the heat dissipation effect, the heat sink is stacked on the switching element, which will increase the total thickness, resulting in the overall volume of the brushless DC motor cannot be reduced.

BRIEF SUMMARY OF THE INVENTION

In view of the above, the primary objective of the present invention is to provide a brushless motor assembly, which could reduce an overall volume of the brushless motor assembly and provide a good heat dissipation effect.

The present invention provides a brushless motor assembly, including a motor body and a circuit board, wherein the circuit board is disposed on the motor body and having a first surface and a second surface that face opposite directions. The first surface faces the motor body. The second surface has a plurality of thermoconductive layouts. A plurality of power switching elements and a plurality of heat sinks are disposed on the second surface. Each of the power switching elements and each of the heat sinks are connected to one of the thermoconductive layouts, so that a thermal energy generated by each of the power switching elements is transferred to each of the heat sinks through each of the thermoconductive layouts.

With the aforementioned design, the power switching elements and the heat sinks are juxtaposed on the second surface of the circuit board, which could improve the disadvantage of increasing total thickness caused by the stacked power switching elements and heat sinks of the conventional brushless motor, reducing the overall volume of the brushless motor assembly.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
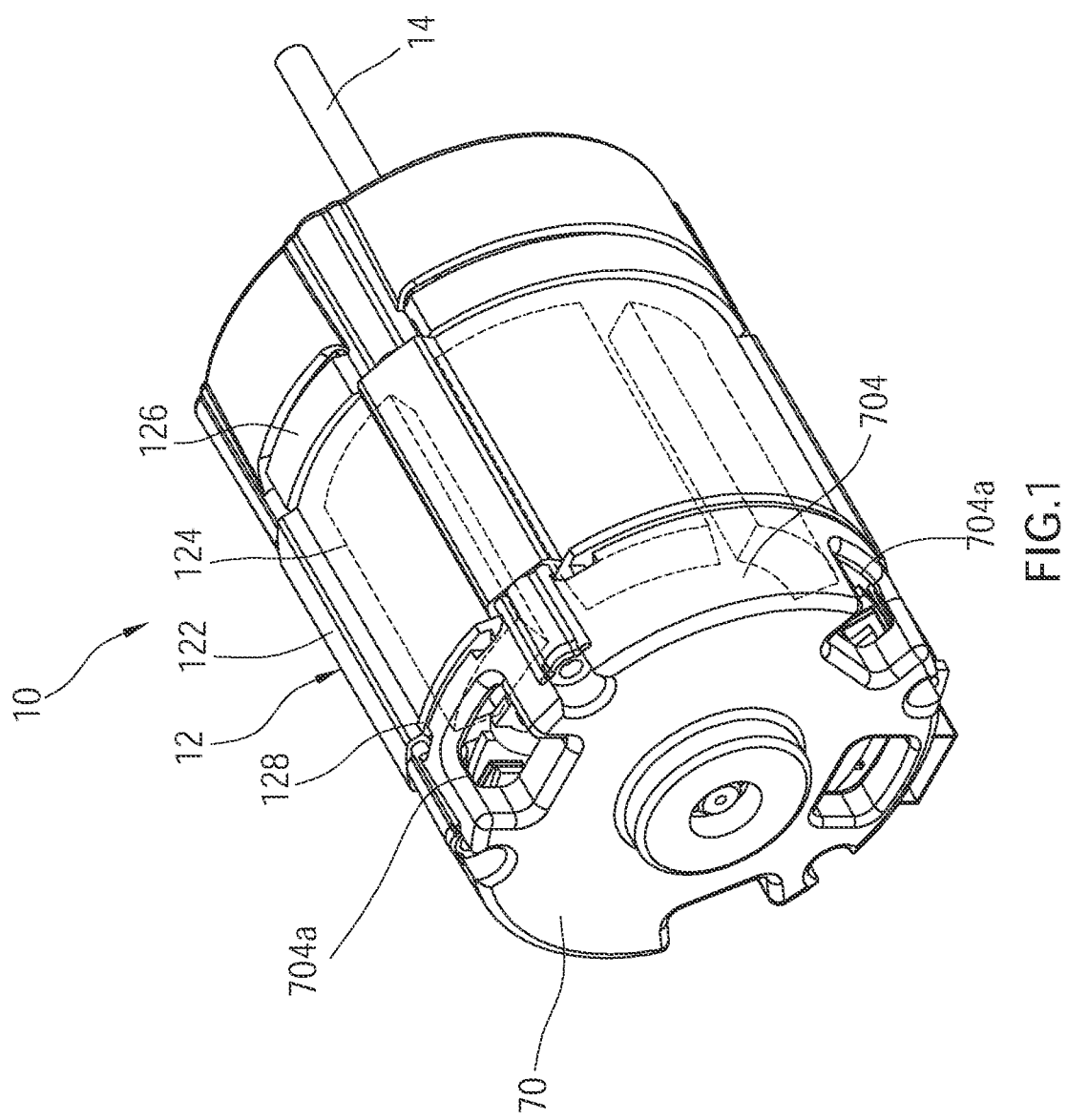
FIG. 1 is a perspective view of the brushless motor assembly according to an embodiment of the present invention.
Figure 2:
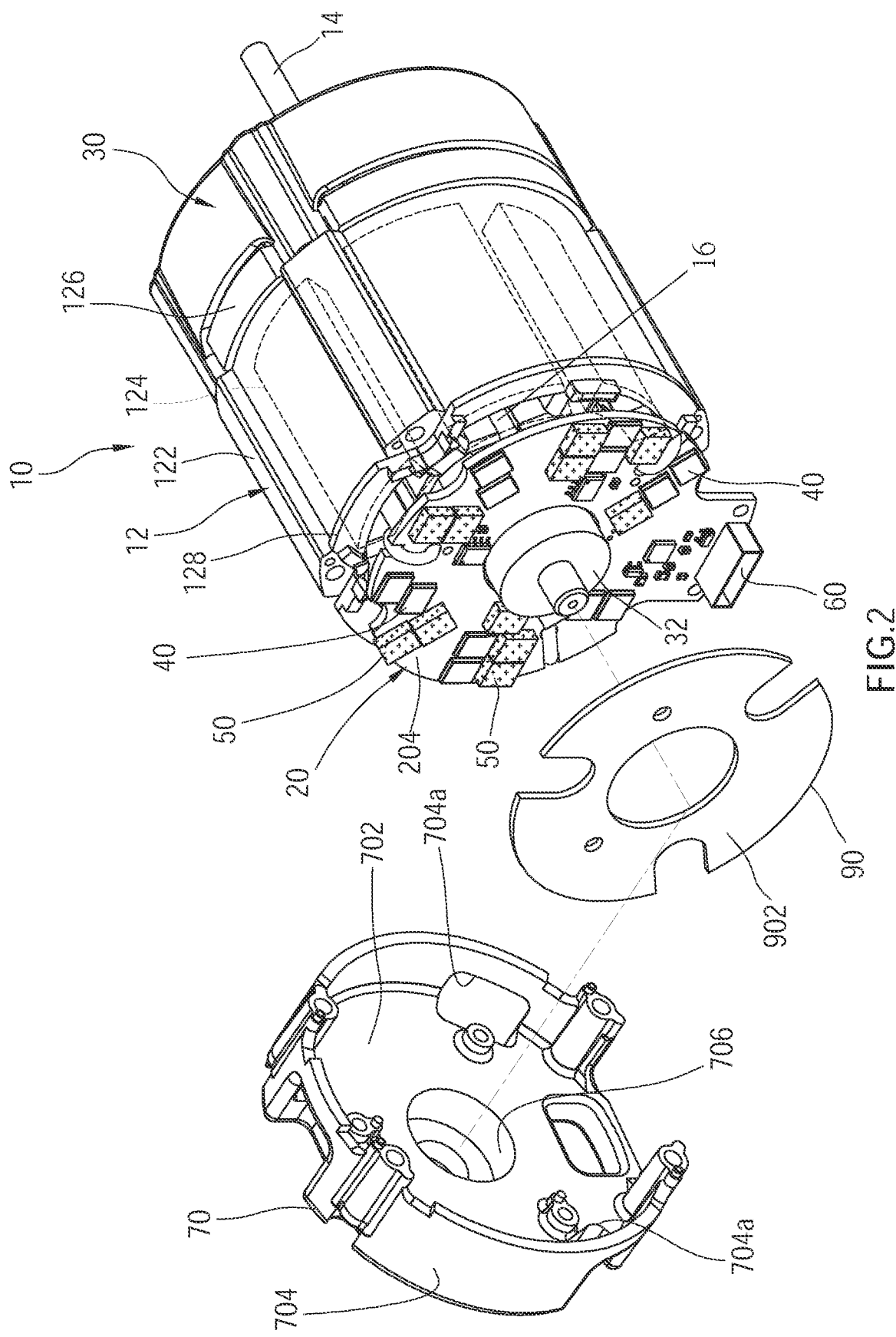
FIG. 2 is a partially exploded view of the brushless motor assembly according to the embodiment of the present invention.
Figure 3:
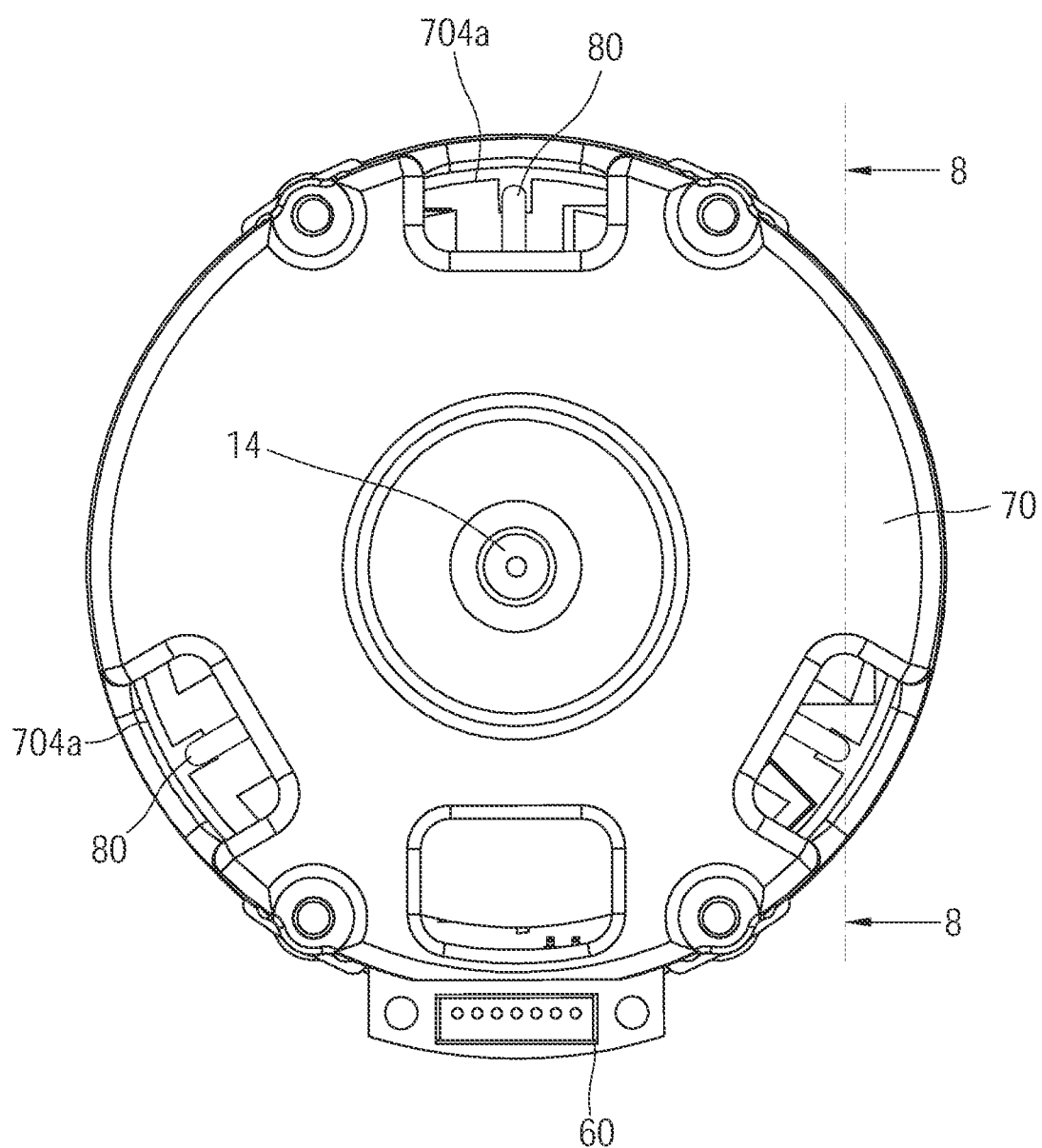
FIG. 3 is a rear view of the brushless motor assembly according to the embodiment of the present invention.

A brushless motor assembly according to an embodiment of the present invention is illustrated in FIG. 1 to FIG. 8 and includes a motor body 10, a circuit board 20, and a plurality of electronic elements.

The motor body 10 includes a stator assembly 12, a rotor 16, and a rotating shaft 14, wherein the stator assembly 12 includes a stator core 122, a plurality of stator coils 124, a front insulating plate 126, and a rear insulating plate 128. The stator coils 124 are disposed in the stator core 122. The front insulating plate 126 and the rear insulating plate 128 are respectively disposed at two ends of the stator core 122, wherein the front insulating plate 126 and the rear insulating plate 128 respectively form a front end and a rear end of the stator assembly 12 in an axial direction of the motor body 10. The front insulating plate 126 is further engaged with a front cover 30.

The rotor 16 is magnetic and is located in the stator core 122. The rotating shaft 14 is engaged with the rotor 16, and a part of the rotating shaft 14 is located inside the stator assembly 12, wherein a front end of the rotating shaft 14 penetrates through the front insulating plate 126 and the front cover 30, and a rear end of the rotating shaft 14 penetrates through the rear insulating plate 128 and is provided with a bearing 32.

The circuit board 20 is disposed on the motor body 10. In the current embodiment, the circuit board 20 is disposed on the rear insulating plate 128 of the motor body 10. The circuit board 20 has a first surface 202 and a second surface 204 which face opposite directions, wherein the first surface 202 faces toward the rear insulating plate 128.

Figure 6:
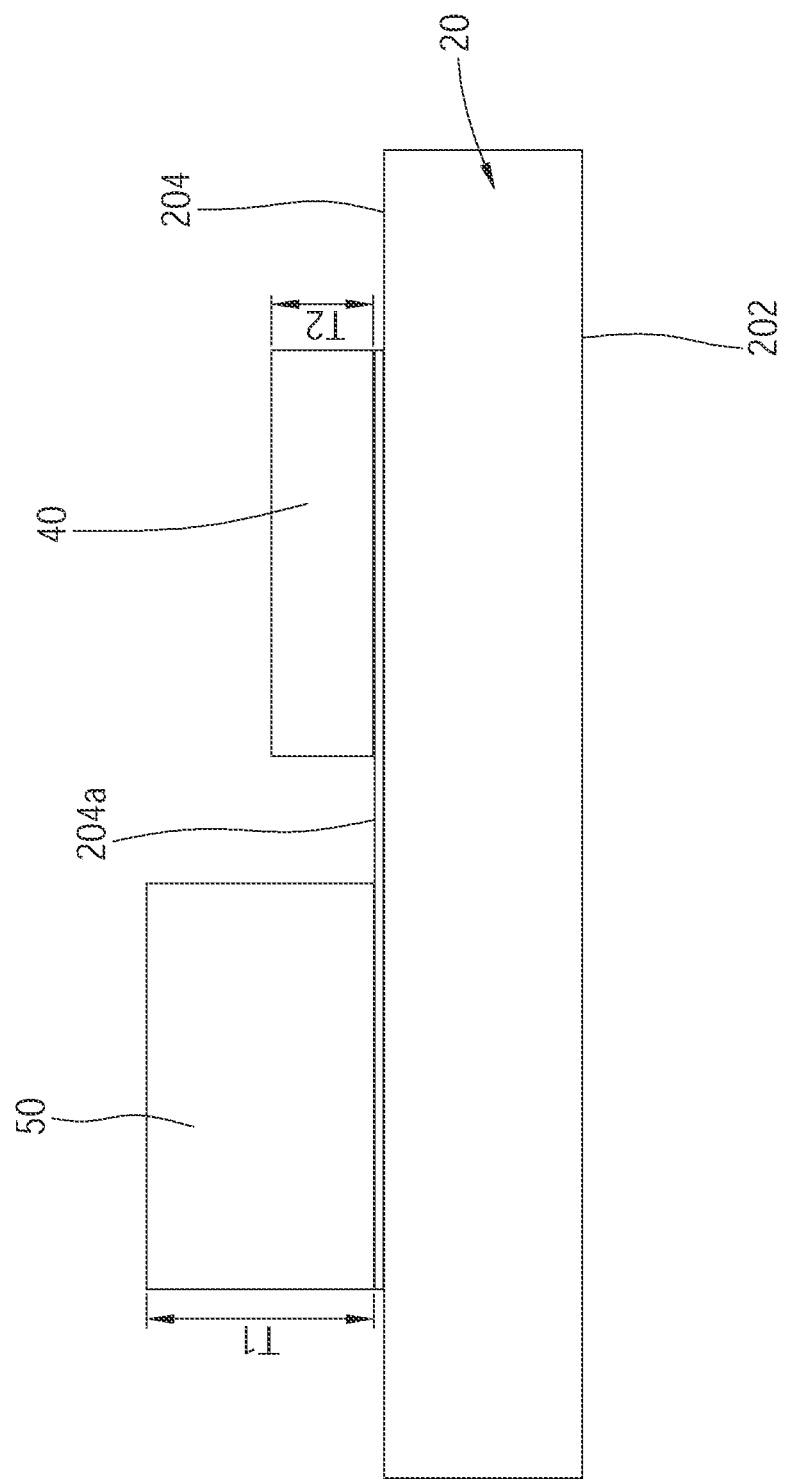
FIG. 6 is a schematic view, showing the heat sinks and the power switching elements are disposed on the circuit board.
Figure 7:
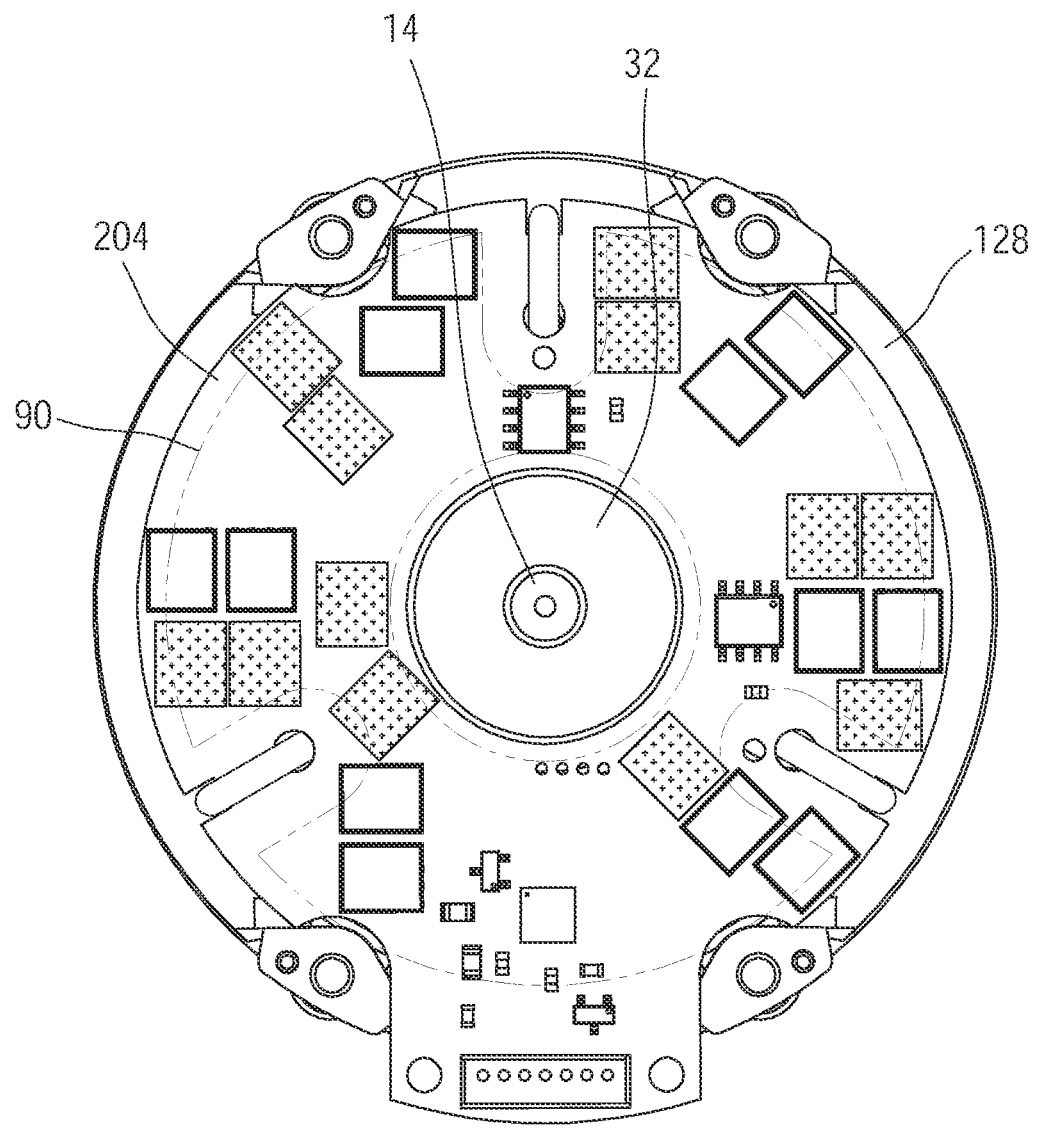
FIG. 7 is a schematic view, showing the thermoconductive pad covers the heat sinks.
Figure 8:
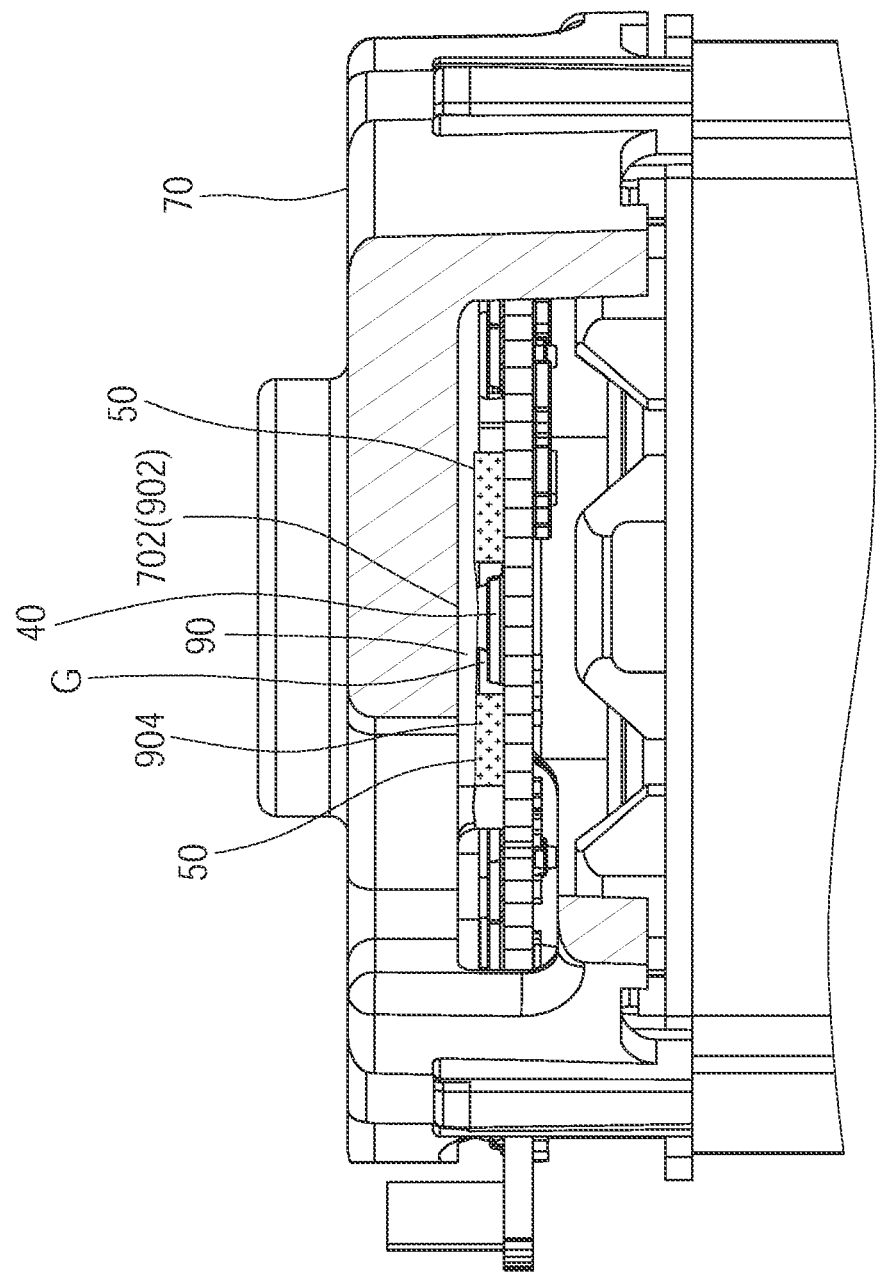
FIG. 8 is a sectional view along the 8-8 line in FIG. 3.

The first surface 202 and the second surface 204 of the circuit board 20 are adapted to dispose the electronic elements. In the current embodiment, both of the first surface 202 and the second surface 204 have a plurality of signal transmitting layouts (not shown) which is adapted to be electrically connected to the electronic elements as a signal transmitting path of each of the electronic elements. In addition, the second surface 204 further has a plurality of thermoconductive layouts 204a (as shown in FIG. 6). In the current embodiment, both of the signal transmitting layouts and the thermoconductive layouts 204a are copper foil as an example.

The electronic elements include a plurality of power switching elements 40, wherein the power switching elements 40 could be MOSFETs. The power switching elements 40 are disposed on the second surface 204 and are respectively connected to the thermoconductive layouts 204a, wherein each of the power switching elements 40 directly contacts one of the thermoconductive layouts 204a or is connected to one of the thermoconductive layouts 204a via a thermoconductive element. The thermoconductive element could be solder, thermal paste, or thermal grease. A plurality of heat sinks 50 are disposed on the second surface 204 and are respectively connected to the thermoconductive layouts 204a, wherein each of the heat sinks 50 directly contacts one of the thermoconductive layouts 204a or is connected to one of the thermoconductive layouts 204a via the thermoconductive element. Referring to FIG. 6, in a direction perpendicular to the second surface 204, a thickness T1 of each of the heat sinks 50 is greater than a thickness T2 of each of the power switching elements 40.

A material of each of the heat sinks 50 is a metal such as, for example, copper. A heat dissipation area of each of the heat sinks 50 is greater than a heat dissipation area of each of the power switching elements 40. A part of a thermal energy emitted by each of the power switching elements 40 is conducted to each of the heat sinks 50 via each of the thermoconductive layouts 204a and dissipated through the heat sinks 50, and another part of the thermal energy is dissipated by the power switching elements 40 themselves. Each of the heat sinks 50 could further have a plurality of recesses for increasing the heat dissipation area.

Since the power switching elements 40 and the heat sinks 50 are juxtaposed on the second surface 204 of the circuit board 20, the disadvantage of increasing total thickness caused by the stacked power switching elements and heat sinks of the conventional brushless motor could be improved. In this way, an overall volume of the brushless motor assembly could be reduced, especially a length of the brushless motor assembly in the axial direction could be reduced. In practice, the circuit board 20 could be disposed on lateral sides of the motor body 10 (i.e., on a radial periphery of the stator core 122), wherein the first surface 202 of the circuit board 20 faces the stator core 122, thereby to reduce the length of the brushless motor assembly in the axial direction.

Figure 4:
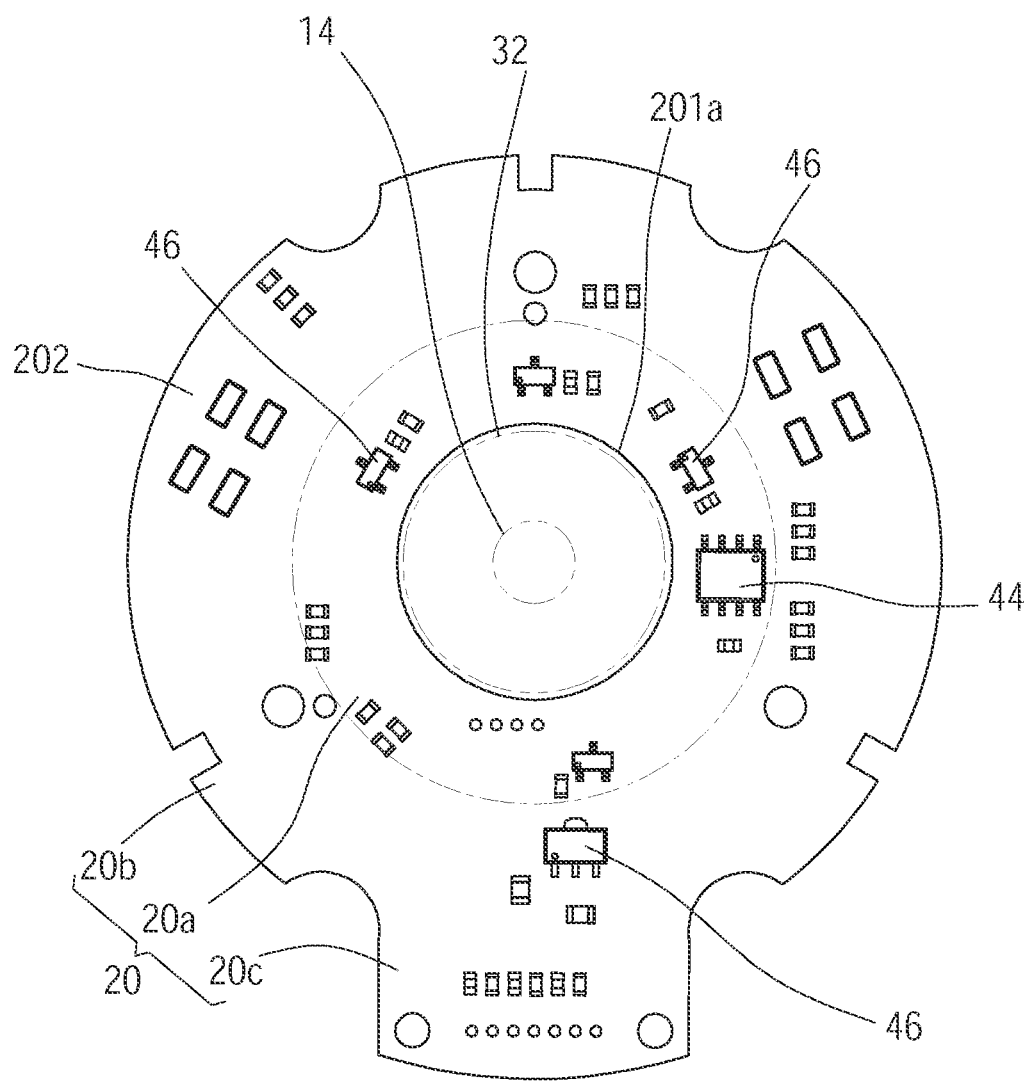
FIG. 4 is a front view of the first surface of the circuit board of the brushless motor assembly according to the embodiment of the present invention.
Figure 5:
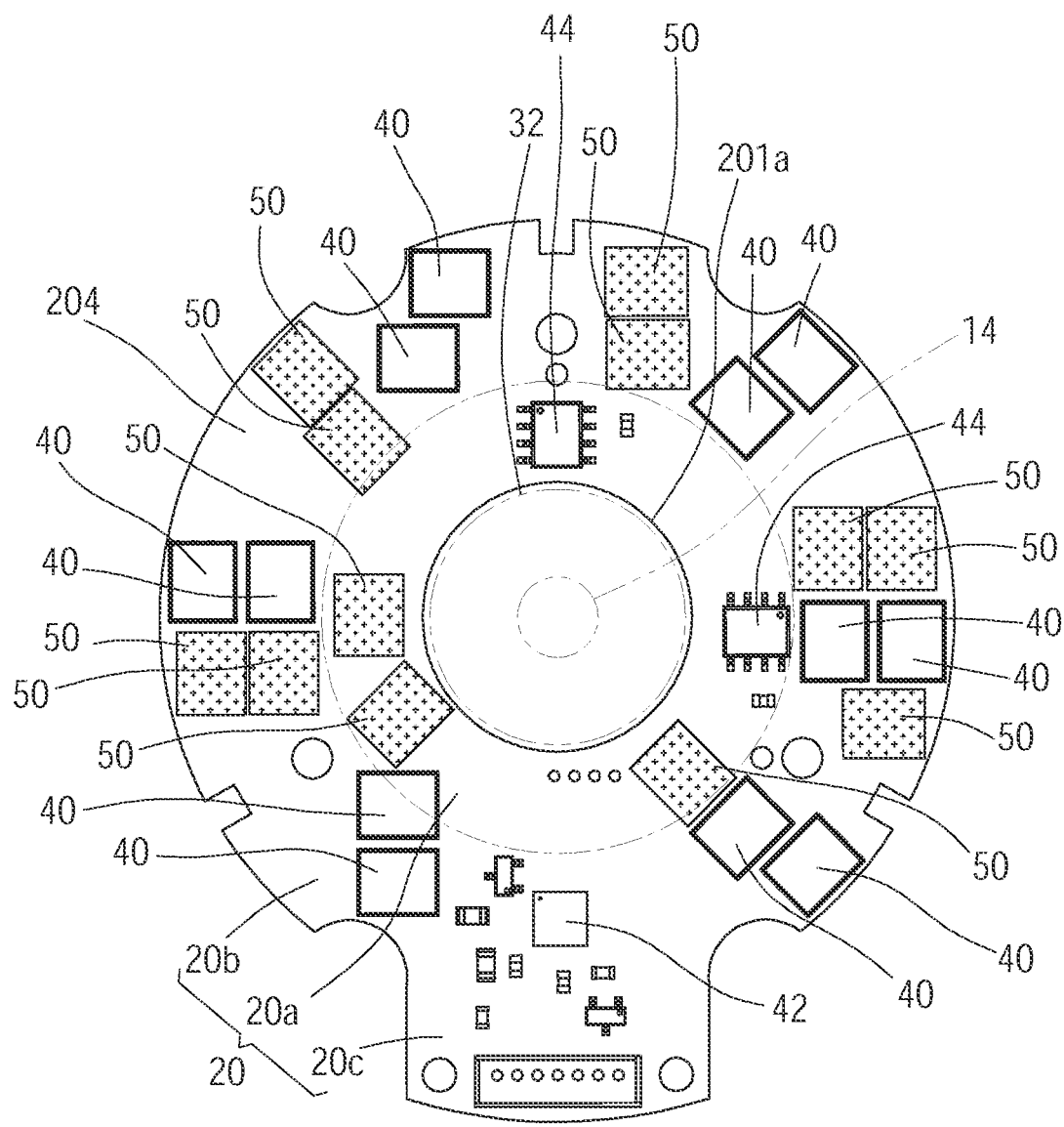
FIG. 5 is a front view of the first surface of the circuit board of the brushless motor assembly according to the embodiment of the present invention.

Referring to FIG. 4 and FIG. 5, in the current embodiment, the circuit board 20 has an inner circular portion 20a, an outer annular portion 20b surrounding the inner circular portion 20a, and a side portion 20c connected to the outer annular portion 20b, wherein dot-dash lines in FIG. 4 and FIG. 5 illustrate a boundary between the inner circular portion 20a and the outer annular portion 20b. The inner circular portion 20a is provided with a through hole 201a, wherein the rotating shaft 14 and the bearing 32 pass through the through hole 201a. Most of the power switching elements 40 are located on the outer annular portion 20b. Most of the heat sinks 50 are located on the outer annular portion 20b, and a few heat sinks 50 are located on the inner circular portion 20a. However, arrangements of the power switching elements 40 and the heat sinks 50 are not a limitation of the present invention. For example, all of the heat sinks 50 could be located on the outer annular portion 20b in other embodiments. An electrical connector 60 is disposed on the side portion 20c and is adapted to be connected to an external control device. The electronic elements include a microcontroller 42 disposed on the second surface 204 and located at a junction between the outer annular portion 20b and the side portion 20c.

The electronic elements include at least one driving member 44 disposed on the second surface 204 of the circuit board 20 and located on the inner circular portion 20a. In the current embodiment, the at least one driving member 44 includes a plurality of driving members 44, wherein one of the driving members 44 is disposed on the inner circular portion 20a of the first surface 202. The driving members 44 are respectively and electrically connected to the power switching elements 40. The driving members 44 could be, for example, gate drivers for receiving a control signal sent by the microcontroller 42 to drive gate electrodes of the power switching elements 40, making each of the power switching elements 40 turns on or off. A thermal energy generated by each of the driving members 44 is smaller than a thermal energy generated by each of the power switching elements 40.

The electronic elements further include a plurality of Hall sensors 46 disposed on the first surface 202 of the circuit board 20 and located on the inner circular portion 20a and adapted to detect a rotation of the rotor 16. A thermal energy generated by each of the Hall sensors 46 is smaller than the thermal energy generated by each of the driving members 44 and is smaller than the thermal energy generated by each of the power switching elements 40.

By arranging the power switching elements 40, which generate more thermal energy, closer to the outer annular portion 20b, the thermal energy generated by the power switching elements 40 could be dissipated easily.

In order to protect the circuit board 20 and the electronic elements, in the current embodiment, the brushless motor assembly further includes a rear cover 70, wherein the rear cover 70 is engaged with the rear insulating plate 128 of the stator assembly 12 and has an inner surface 702. The circuit board 20 is located between the inner surface 702 of the rear cover 70 and the rear insulating plate 128, wherein the inner surface 702 faces the second surface 204 of the circuit board 20. The rear cover 70 could be made of metal to increase heat dissipation effect. The rear cover 70 has an outer peripheral portion 704 located on an outer periphery of the outer annular portion 20b of the circuit board 20 and having a plurality of heat dissipation openings 704a, wherein the heat dissipation openings 704a communicate with an inside and an outside of the rear cover 70. The thermal energy generated by the power switching elements 40 could be dissipated through the heat dissipation openings 704a. The rear cover 70 has a receiving groove 706 recessed into the inner surface 702 and adapted to be abutted against the bearing 32.

The circuit board 20 is connected to the stator coils 124 via a plurality of wires 80. In the current embodiment, the wires 80 includes three wires respectively corresponding to the three-phase stator coils 124. An end of the wires 80 is soldered to the circuit board 20 and passes the second surface 204 and passes through the stator core 122 to be connected to the stator coils 124, wherein a part of each of the wires 80 is exposed via one of the heat dissipation openings 704a. In this way, a thermal energy generated by the wires 80 could be dissipated through the heat dissipation openings 704a.

A thermoconductive pad 90 could be further disposed between the rear cover 70 and the circuit board 20. The thermoconductive pad 90 is made of an electrical insulation material and is flexible, for example, a thermoconductive silicone pad. The thermoconductive pad 90 has a first thermoconductive surface 902 and a second thermoconductive surface 904, wherein the first thermoconductive surface 902 is connected to the inner surface 702 of the rear cover 70. The first thermoconductive surface 902 directly contacts and abuts against the inner surface 702, or abuts against the inner surface 702 via the thermoconductive element (thermal paste or thermal grease). The second thermoconductive surface 904 and the first thermoconductive surface 902 face opposite directions and are connected to the heat sinks 50. The second thermoconductive surface 904 directly contacts and abuts against the heat sinks 50, or abuts against the heat sinks 50 via the thermoconductive element (thermal paste or thermal grease). The thermoconductive pad 90 could effectively conduct the thermal energy generated by the heat sinks 50 to the rear cover 70 and dissipate it from the rear cover 70. In the current embodiment, the thermoconductive pad 90 does not tough the power switching elements 40 and other electronic elements, avoiding the thermoconductive pad 90 from transferring the thermal energy to the power switching elements 40 and other electronic elements on the second surface 204 of the circuit board 20. In addition, the power switching elements 40 are spaced from the thermoconductive pad 90 by a gap G, wherein the gap G could form an air channel communicating with outside, so that the power switching elements 40 and other electronic elements on the second surface 204 of the circuit board 20 could dissipate through the gap G.

It must be pointed out that the embodiments described above are only some preferred embodiments of the present invention. All equivalent structures which employ the concepts disclosed in this specification and the appended claims should fall within the scope of the present invention.

What is claimed is:

1. A brushless motor assembly, comprising:
   a motor body; and
   a circuit board disposed on the motor body and having a first surface and a second surface which face opposite directions, wherein the first surface faces the motor body; a plurality of thermoconductive layouts is formed on the second surface; a plurality of power switching elements and a plurality of heat sinks are disposed on the second surface; each of the power switching elements and each of the heat sinks are connected to one of the thermoconductive layouts, and the power switching elements and the heat sinks are physically disposed on the thermoconductive layouts side by side so as to not overlap with each other, so that a thermal energy generated by each of the power switching elements is transferred to each of the heat sinks through each of the thermoconductive layouts.

2. The brushless motor assembly as claimed in claim 1, wherein the motor body comprises a stator assembly and a rotating shaft; the stator assembly has a front end and a rear end; the rotating shaft is located in the stator assembly and penetrates through the front end and the rear end; the circuit board is disposed on the rear end, and the first surface faces the rear end.

3. The brushless motor assembly as claimed in claim 2, further comprising a rear cover engaged with the rear end of the stator assembly, wherein the rear cover has an inner surface; the circuit board is located between the inner surface of the rear cover and the rear end; the inner surface faces the second surface of the circuit board.

4. The brushless motor assembly as claimed in claim 3, further comprising a thermoconductive pad disposed between the rear cover and the circuit board, wherein the thermoconductive pad has a first thermoconductive surface and a second thermoconductive surface which face opposite directions; the first thermoconductive surface is connected to the inner surface of the rear cover; the second thermoconductive surface is connected to the heat sinks.

5. The brushless motor assembly as claimed in claim 4, wherein the second thermoconductive surface of the thermoconductive pad is spaced from each of the power switching elements by a gap.

6. The brushless motor assembly as claimed in claim 3, wherein the circuit board has an inner circular portion and an outer annular portion; the inner circular portion has a through hole; the rotating shaft passes through the through hole; the outer annular portion surrounds the inner circular portion; most of the power switching elements are located on the outer annular portion.

7. The brushless motor assembly as claimed in claim 6, wherein at least one driving member is disposed on the inner circular portion of the second surface and is adapted to drive the power switching elements.

8. The brushless motor assembly as claimed in claim 6, wherein the rear cover has an outer peripheral portion located on an outer periphery of the outer annular portion and having a plurality of heat dissipation openings.

9. The brushless motor assembly as claimed in claim 8, further comprising a plurality of wires, wherein an end of each of the wires is connected to one of a plurality of stator coils of the stator assembly; the wires pass the second surface of the circuit board and are engaged with the circuit board; a part of each of the wires is exposed via one of the heat dissipation openings.

10. The brushless motor assembly as claimed in claim 6, wherein a plurality of Hall sensors is disposed on the inner circular portion of the first surface; the motor body comprises a rotor which is magnetic; the Hall sensors are adapted to detect a rotation of the rotor.

* * * * *